(12) United States Patent
Yi

(10) Patent No.: US 11,121,191 B2
(45) Date of Patent: Sep. 14, 2021

(54) DISPLAY DEVICE

(71) Applicant: Wuhan China Star Optoelectronics Semiconductor Display Technology Co., Ltd., Hubei (CN)

(72) Inventor: Shijuan Yi, Hubei (CN)

(73) Assignee: WUHAN CHINA STAR OPTOELECTRONICS SEMICONDUCTOR DISPLAY TECHNOLOGY CO., LTD., Hubei (CN)

( * ) Notice: Subject to any disclaimer, the term of this patent is extended or adjusted under 35 U.S.C. 154(b) by 193 days.

(21) Appl. No.: 16/326,696

(22) PCT Filed: Jan. 15, 2019

(86) PCT No.: PCT/CN2019/071754
§ 371 (c)(1),
(2) Date: Feb. 19, 2019

(87) PCT Pub. No.: WO2020/103327
PCT Pub. Date: May 28, 2020

(65) Prior Publication Data
US 2021/0005674 A1    Jan. 7, 2021

(30) Foreign Application Priority Data
Nov. 22, 2018   (CN) .......................... 201811401042.0

(51) Int. Cl.
*H01L 27/32*     (2006.01)
(52) U.S. Cl.
CPC ........ *H01L 27/323* (2013.01); *H01L 27/3276* (2013.01)

(58) Field of Classification Search
CPC ............... H01L 27/323; H01L 27/3276; G02F 1/13338; G06F 3/0412; G06F 3/0416
See application file for complete search history.

(56) References Cited

U.S. PATENT DOCUMENTS

| | | | |
|---|---|---|---|
| 2015/0160761 A1* | 6/2015 | Lee | G06F 3/04184 345/174 |
| 2016/0132148 A1* | 5/2016 | Han | G06F 3/0416 345/174 |
| 2018/0059855 A1* | 3/2018 | Gwon | G06F 3/0416 |
| 2018/0321765 A1 | 11/2018 | Chiang et al. | |
| 2019/0377445 A1* | 12/2019 | Jeong | G06F 1/26 |

FOREIGN PATENT DOCUMENTS

| | | |
|---|---|---|
| CN | 107643853 A | 1/2018 |
| CN | 108803923 A | 11/2018 |
| WO | 2018205671 A1 | 11/2018 |

* cited by examiner

*Primary Examiner* — Sardis F Azongha
(74) *Attorney, Agent, or Firm* — Hamre, Schumann, Mueller & Larson, P.C.

(57) ABSTRACT

A display panel is provided, and includes an array metal layer to form lines for transmitting a display signal to a display region, and a touch metal layer to form lines for transmitting a touch signal to a plurality of touch units. At least one touch signal interconnection region connects the lines of the array metal layer with the lines of the touch metal layer, so that a single touch and drive integrated chip can be used to process the display signal and the touch signal. Display noise caused by separation of a display chip and a touch chip in an original system architecture is thus avoided, and the number of components and the overall cost are reduced.

8 Claims, 10 Drawing Sheets

DISPLAY DEVICE

FIELD OF INVENTION

The present disclosure relates to a touch panel structure, and more particularly to an active-matrix organic light emitting diode (AMOLED) touch panel structure having a touch and drive integrated chip and a corresponding circuit design.

BACKGROUND OF DISCLOSURE

An active-matrix organic light emitting diode panel, referred to as an AMOLED panel, has a self-luminous property and is made of a thin organic material coating and a glass substrate. When a current passes through an AMOLED panel, these organic materials glow. Since AMOLED panels are self-illuminating, unlike thin film transistor liquid crystal displays (TFT LCD), which require backlight components, AMOLED panels have advantages, such as wide viewing angles and high color saturation, especially the low driving voltage and power consumption thereof. AMOLED panels are characterized by fast responses, light weight, thin thickness, simple structures and low costs, and regarded as one of the most promising products. However, designs of general AMOLED touch panels require both a display chip (display integrated circuit, DIC) and a touch chip (touch integrated circuit TIC), thus making the overall cost high.

Referring to FIG. 1 and FIG. 2. FIG. 1 is a top view of a conventional display panel. FIG. 2 is a partial side cross-sectional view of a conventional display panel. As shown in FIG. 1 and FIG. 2, a conventional display panel 900 mainly includes a display region (active area) 901, a non-display region 902, and a driver chip (driver IC) 903. The display region 901 is disposed within the non-display region 902, the driving chip 903 is also disposed within the non-display region 902 and below the lower edge of the display region 901.

In addition, as shown in FIG. 2, the display panel 900 further includes an array metal layer A and a touch metal layer B. The array metal layer A is generally disposed to be the lower layer of the structure for forming lines to transmit display signals to the display region, the touch metal layer B is generally disposed to be an upper layer of the structure for forming lines to transmit touch signals to a plurality of touch units.

Furthermore, the display panel 900 further includes a flexible printed circuit (FPC) 904, a transmission signal line (Tx signals) 905, a reception signal line (Rx signals) 906, and a touch panel chip (touch panel IC) 907. The flexible printed circuit 904 is connected to the lower edge of the non-display region 902. The transmission signal line 905 enters the non-display region 902 from the left side of the flexible printed circuit 904, and extends along the outside of the upper side, the left side, and the lower side of the display region 901. The receiving signal line 906 enters the non-display region 902 from the right side of the flexible printed circuit 904 and is located outside the right side of the display region 901.

In addition, the transmission signal lines 905 and the reception signal lines 906 are touch panel signal lines (TP signals) manufactured by a direct on cell touch patterning (DOT) method. The touch panel signal lines and the display panel signal lines share the flexible printed circuit 904 for bonding. That is, an external signal enters the driving chip 903 through the lines of the flexible printed circuit 904, and controls the display of the display region 901 through the array metal layer A. The touch panel chip 907 is connected to the transmission signal lines 905 and the reception signal lines 906 on the touch metal layer B through the lines of the flexible printed circuit 904

In summary, the conventional display panel 900 has the disadvantage that both the driving chip 903 and the touch chip 907 are required, thus making the cost relatively high. Moreover, the flexible printed circuit 904 must be bonded to the signal lines of the display panel, and the chip and the signal lines of the touch panel, thereby also lengthening the flexible printed circuit 904 and complicating the manufacturing process, thus also making the manufacturing cost high.

Therefore, it is necessary to provide an improved display panel to solve the problem of the existing display panel.

SUMMARY OF INVENTION

Technical Problem

A main object of the present disclosure is to provide a display panel including an array metal layers for providing display signals to a display region, and provide a touch metal layer for providing touch signals to a plurality of touch units. At least one touch signal interconnection region connects the lines of the array metal layer with the lines of the touch metal layer, so that a single touch and drive integrated chip can be used to process the display signal and the touch signal.

Technical Solutions

In order to achieve the above object, a display panel is provided in the present disclosure, including a display region and a non-display region, the non-display region including at least one touch signal interconnection region, a bending region and a chip deploying region sequentially disposed away from the display region, wherein the display panel further includes:

a plurality of touch units disposed on the display region;

an array metal layer configured to form lines for transmitting a display signal to the display region;

a touch metal layer configured to form lines for transmitting a touch signal to the plurality of touch units; and a first insulating layer disposed between the array metal layer and the touch metal layer, and having an interconnection via hole;

wherein the interconnection via hole is disposed in the touch signal interconnection region to connect the touch metal layer with the array metal layer in the bend region, the array metal layer includes a source drain metal layer, the interconnection via hole is configured to connect the source drain metal layer with the touch metal layer, a single touch and drive integrated chip is disposed within the chip deploying region for processing the display signal and the touch signal;

wherein the display signal is transmitted to the display region through the lines of the array metal layer; and the touch signal is transmitted to the plurality of touch units through the lines of the array metal layer located within the bending region, the interconnection via hole located within the touch signal interconnection region, and the lines of the touch metal layer within the non-display region around the display region.

In an embodiment of the present disclosure, the array metal layer further includes a gate metal layer, a second insulating layer is disposed between the gate metal layer and the source drain metal layer, the second insulating layer is provided with a first via hole and a second via hole, a line of the gate metal layer in the bending region is connected with the source drain metal layer located in the bending region through the first via hole, and a line of the gate metal layer in the non-display region is connected with the source drain metal layer located in the non-display region through the second via hole.

In an embodiment of the present disclosure, the touch metal layer includes a first touch metal layer and a second touch metal layer, a touch insulation layer is disposed between the first touch metal layer and the second touch metal layers, the touch insulation layer is provided with a third via hole, and the first touch metal layer is connected with the second touch metal layer through the third via hole.

In an embodiment of the present disclosure, the display panel further includes at least one first sector wire region between the bending region and the display region, wherein the first sector wire region includes a plurality of data lines for connecting the bending region with the display region.

In an embodiment of the present disclosure, the at least one first sector wire region includes two first sector wire regions, and the at least one touch signal interconnection region is located between the two first sector wire regions.

In an embodiment of the present disclosure, the at least one touch signal interconnection region includes two touch signal interconnection regions located between the at least one first sector wire region or on both sides of the at least one first sector wire region.

In an embodiment of the present disclosure, the display panel further includes at least one second sector wire region located in the chip deploying region, wherein the second sector wire region includes a plurality of data lines for connecting the bending region with the touch and drive integrated chip.

In an embodiment of the present disclosure, the at least one second sector wire region includes two second sector wire regions for transmitting the display signal, and a touch signal deploying region is disposed between the two second sector wire regions for transmitting the touch signal.

In order to achieve the above object, a display panel is provided in the present disclosure, including a display region and a non-display region, the non-display region including at least one touch signal interconnection region, a bending region and a chip deploying region sequentially disposed away from the display region, wherein the display panel further includes:

a plurality of touch units disposed on the display region;

an array metal layer configured to form lines for transmitting a display signal to the display region;

a touch metal layer configured to form lines for transmitting a touch signal to the plurality of touch units; and a first insulating layer disposed between the array metal layer and the touch metal layer, and having an interconnection via hole;

wherein the interconnection via hole is disposed in the touch signal interconnection region to connect the touch metal layer with the array metal layer in the bend region.

In an embodiment of the present disclosure, the array metal layer includes a source drain metal layer, the interconnection via hole is configured to connect the source drain metal layer with the touch metal layer.

In an embodiment of the present disclosure, a single touch and drive integrated chip is disposed within the chip deploying region for processing the display signal and the touch signal;

wherein the display signal is transmitted to the display region through the lines of the array metal layer; and the touch signal is transmitted to the plurality of touch units through the lines of the array metal layer located within the bending region, the interconnection via hole located within the touch signal interconnection region, and the lines of the touch metal layer within the non-display region around the display region.

In an embodiment of the present disclosure, the array metal layer further includes a gate metal layer, a second insulating layer is disposed between the gate metal layer and the source drain metal layer, the second insulating layer is provided with a first via hole and a second via hole, a line of the gate metal layer in the bending region is connected with the source drain metal layer located in the bending region through the first via hole, and a line of the gate metal layer in the non-display region is connected with the source drain metal layer located in the non-display region through the second via hole.

In an embodiment of the present disclosure, the touch metal layer includes a first touch metal layer and a second touch metal layer, a touch insulation layer is disposed between the first touch metal layer and the second touch metal layers, the touch insulation layer is provided with a third via hole, and the first touch metal layer is connected with the second touch metal layer through the third via hole.

In an embodiment of the present disclosure, the display panel further includes at least one first sector wire region between the bending region and the display region, wherein the first sector wire region includes a plurality of data lines for connecting the bending region with the display region.

In an embodiment of the present disclosure, the at least one first sector wire region includes two first sector wire regions, and the at least one touch signal interconnection region is located between the two first sector wire regions.

In an embodiment of the present disclosure, the at least one touch signal interconnection region includes two touch signal interconnection regions located between the at least one first sector wire region or on both sides of the at least one first sector wire region.

In an embodiment of the present disclosure, the display panel further includes at least one second sector wire region located in the chip deploying region, wherein the second sector wire region includes a plurality of data lines for connecting the bending region with the touch and drive integrated chip.

In an embodiment of the present disclosure, the at least one second sector wire region includes two second sector wire regions for transmitting the display signal, and a touch signal deploying region is disposed between the two second sector wire regions for transmitting the touch signal.

Beneficial Effects

Through the above specific line schemes, the touch signal is conducted from the touch metal layer to the array metal layer. Display noise caused by the separation of the display chip and the touch chip in the original system architecture is thus avoided, and the number of components and the overall cost are reduced. Moreover, the length of the flexible printed circuit is shortened, the manufacturing process is simplified, the yield of bonding is improved, the manufacturing cost is reduced, and the width of the bottom bezel of the panel is effectively shortened.

DETAILED DESCRIPTION OF PREFERRED EMBODIMENTS

Figure 1:
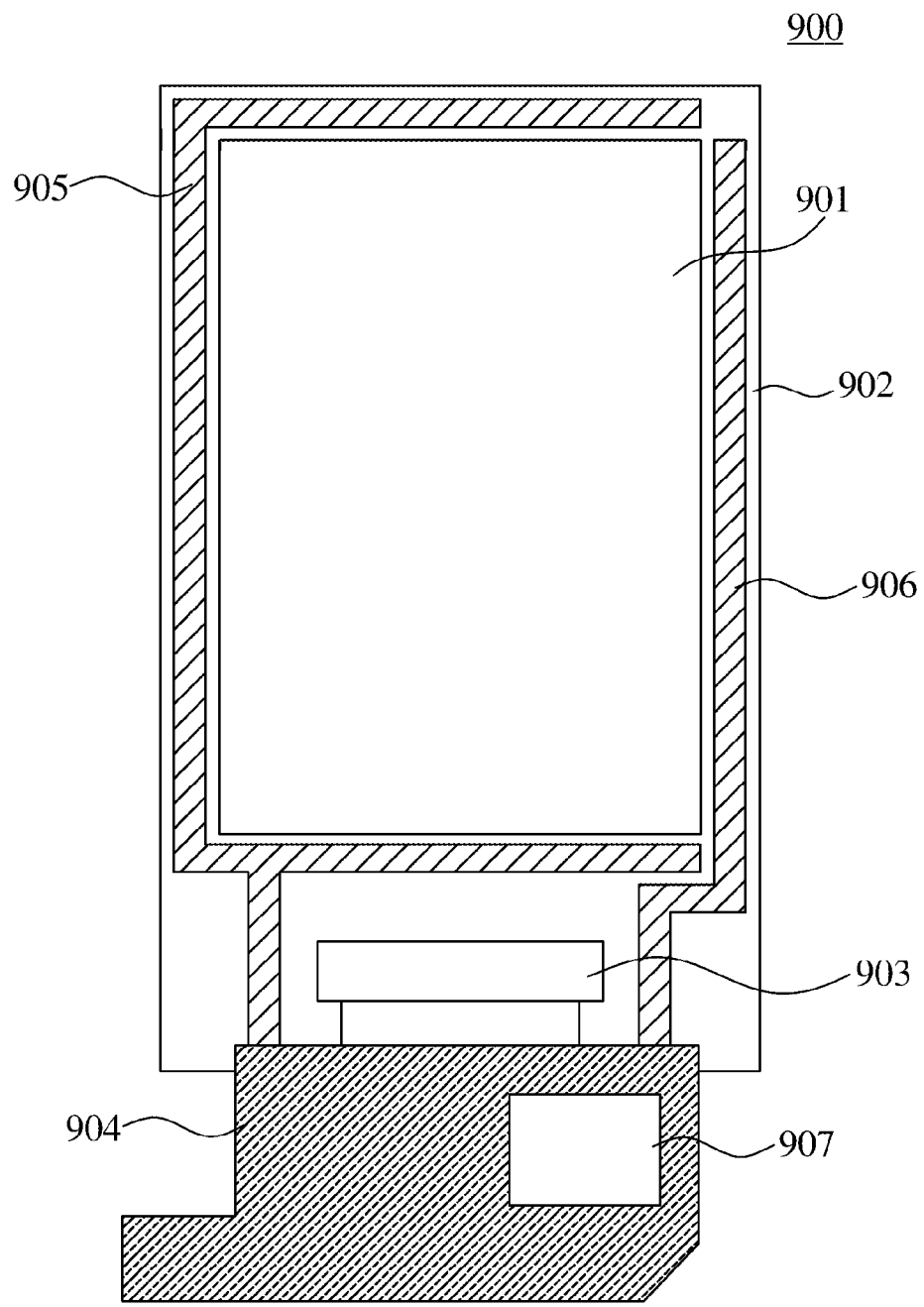
FIG. 1 is a top view of an existing display panel.
Figure 2:
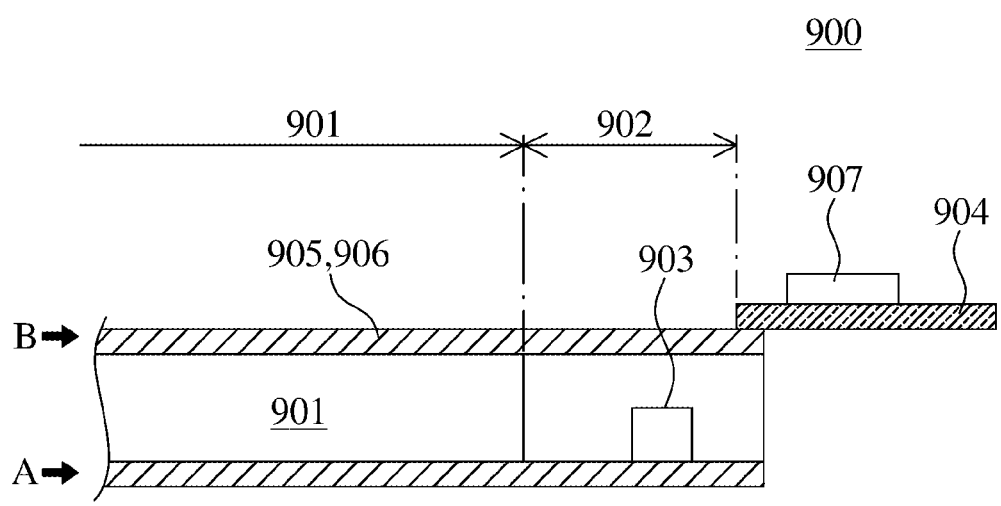
FIG. 2 is a partial side cross-sectional view of an existing display panel.

The following description of the embodiments with reference to the accompanying drawings is used to illustrate particular embodiments of the present disclosure. The directional terms referred in the present disclosure, such as "upper", "lower", "front", "back", "left", "right", "inner", "outer", "side surface", etc. are only directions with regard to the accompanying drawings. Therefore, the directional terms used for describing and illustrating the present disclosure are not intended to limit the present disclosure. In the drawings, units with similar structures are indicated by the same reference number.

First, the following description is made for the technical field and the terminology of the present disclosure. The present disclosure is described by taking a direct on cell touch patterning (DOT) design in touch panel designs as an example, but the application of the present disclosure is not limited thereto. The DOT design is a process of forming a touch panel layer (TP layer) directly on a thin film encapsulation (TFE) of an active-matrix organic light emitting diode (AMOLED), such as a design method, in which a touch layer is directly deposited on the thin film encapsulation, and the touch layer is patterned by a yellow light process, to form the touch panel layer pattern.

In addition, when the driving chip (driver IC) is bonded onto a rigid panel, it is referred to as chip on glass (COG). When the driving chip (driver IC) is bonded onto a flexible panel (flexible AMOLED panel), it is referred to as chip on plastic (COP). The schemes proposed in this design are suitable for both rigid panel designs and flexible panel designs.

In addition, a display panel provided in the present disclosure particularly relates to a design scheme of touch and display diver integration (TDDI) of an AMOLED panel, in which a touch and drive integrated chip (integrated touch and OLED driver IC, TODIC) is directly bonded onto the panel, rather than encapsulating a touch chip (touch integrated circuit, TIC) on a flexible printed circuit (FPC) in a conventional method.

Figure 3:
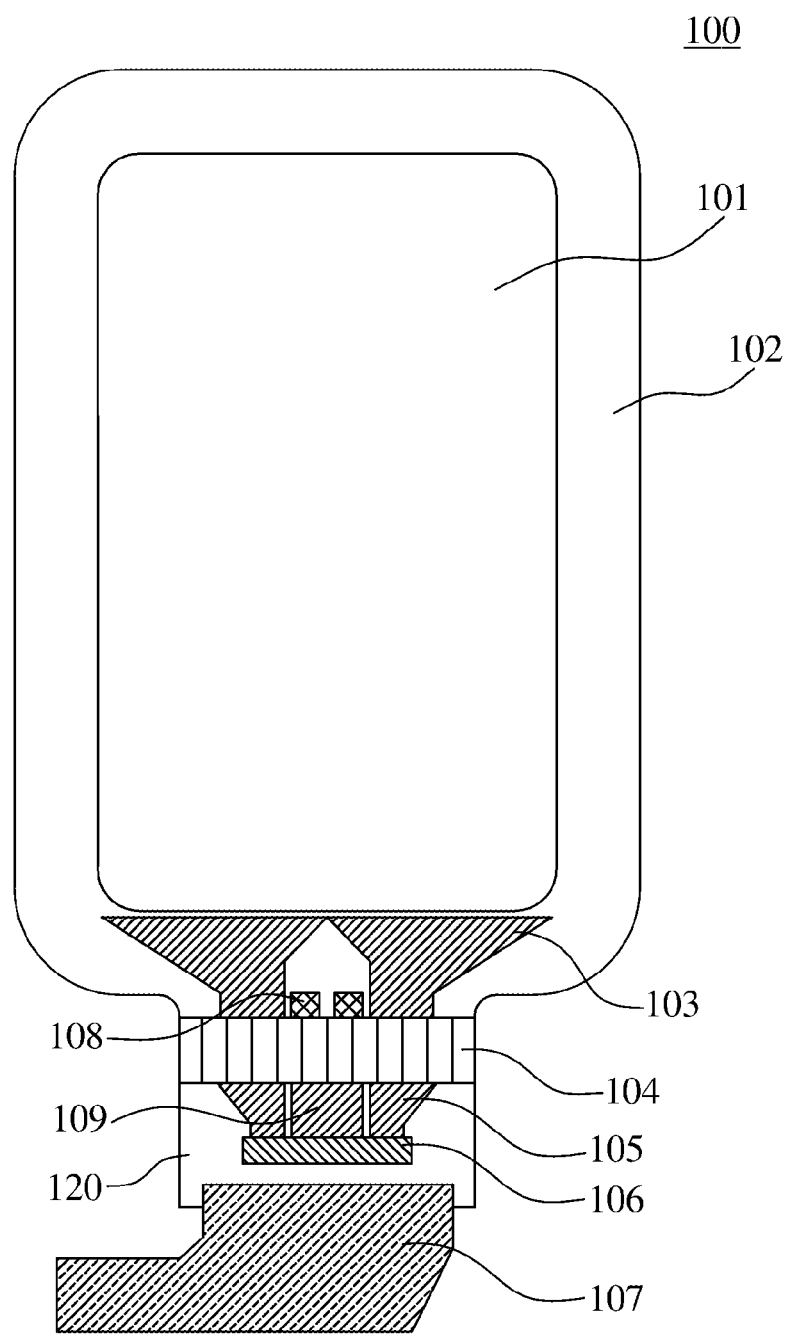
FIG. 3 is a top plan view (excluding touch lines) of a display panel in accordance with a first embodiment of the present disclosure.

Referring to FIG. 3, which is a top plan view of a display panel in accordance with a first embodiment of the present disclosure, and touch lines are not included in this figure. As shown in FIG. 3, a display panel 100 of the present disclosure mainly includes a display region (active area) 101, a non-display region 102, at least a first sector wire region 103, and a bending region 104, at least one second sector wire region 105, a chip deploying region 120, and a touch and drive integrated chip 106. The non-display region 102 is a peripheral region surrounding the display region 101. That is, the non-display region 102 is disposed around the display region 101. In addition, the bending region 104 is disposed adjacent to the non-display region 102, and the chip deploying region 120 is disposed adjacent to the bending region 104. Furthermore, the at least one first sector wire region 103, the bending region 104, the at least one second sector wire region 105, and the touch and drive integrated chip 106 are sequentially disposed below the lower edge of the display region 101.

Specifically, as shown in FIG. 3, a rounded corner design may be adopted as four corners of the display region 101, and a rounded corner design may be adopted as four corners of the non-display region. The at least one first sector wire region 103 and the at least one second sector wire region 105 are sector-shaped circuit designs of data lines of the display panel. In the embodiment, the sector wire regions are respectively two. One is on the left side, and the other is on the right side, but in the present disclosure, these sector wire regions are not limited to the specific number and the position, and users can adjust it according to actual needs.

In addition, the bending region 104 provides a connection at two ends thereof, and a substrate included in the bending region 104 is a polyimide (PI) substrate, so that the bending zone 104 can be bent and folded at will. In common cases, the lower part thereof is bent to the back of the panel. In addition, metal lines of an array layer are deployed on the bending region 104, such as touch panel (TP) signal lines, lines of a gate drive circuit substrate (gate on array, GOA), data signal lines, power lines, etc. Signals of the above lines are generated by the touch and drive integrated chip 106.

In addition, as shown in FIG. 3, a display panel 100 of the present disclosure further includes a flexible printed circuit (FPC) 107, at least one touch signal interconnection region 108, and a touch signal deploying region 109. The flexible printed circuit 107 has no touch chip (touch integrated circuit, TIC) encapsulated thereon, in contrast to the conventional method, and only provides a signal connection to the outside of the panel. The touch signal deploying region 109 outputs the touch signal generated by the touch control and driving integrated chip 106.

As described above, all of the signal lines layers illustrated in FIG. 3 belong to the TFT array metal layer, and these signal lines are mostly in a general design. What is particularly is that the at least one touch signal interconnection region 108 and the touch signal deploying region 109 are specifically deployed for the signal requirement of the touch panel. The at least one touch signal interconnection region 108 is disposed in the non-display region 102, is preferably adjacent to the bending region 104, and is a region specially deployed for the signal of the touch lines passing to a different layer. The touch signal can be transferred from the touch metal layer to the array metal layer in this region. In this embodiment, the at least one touch signal interconnection region 108 includes two, which are disposed between the two first sector wire regions 103, but in the present disclosure, the touch signal interconnection regions are limited to the specific number and the position, and users can adjust it according to actual needs. In addition, the at least one touch signal interconnection region 108 may include, for example, a plurality of via holes (not shown) for a plurality of lines to pass therethrough.

Figure 4:
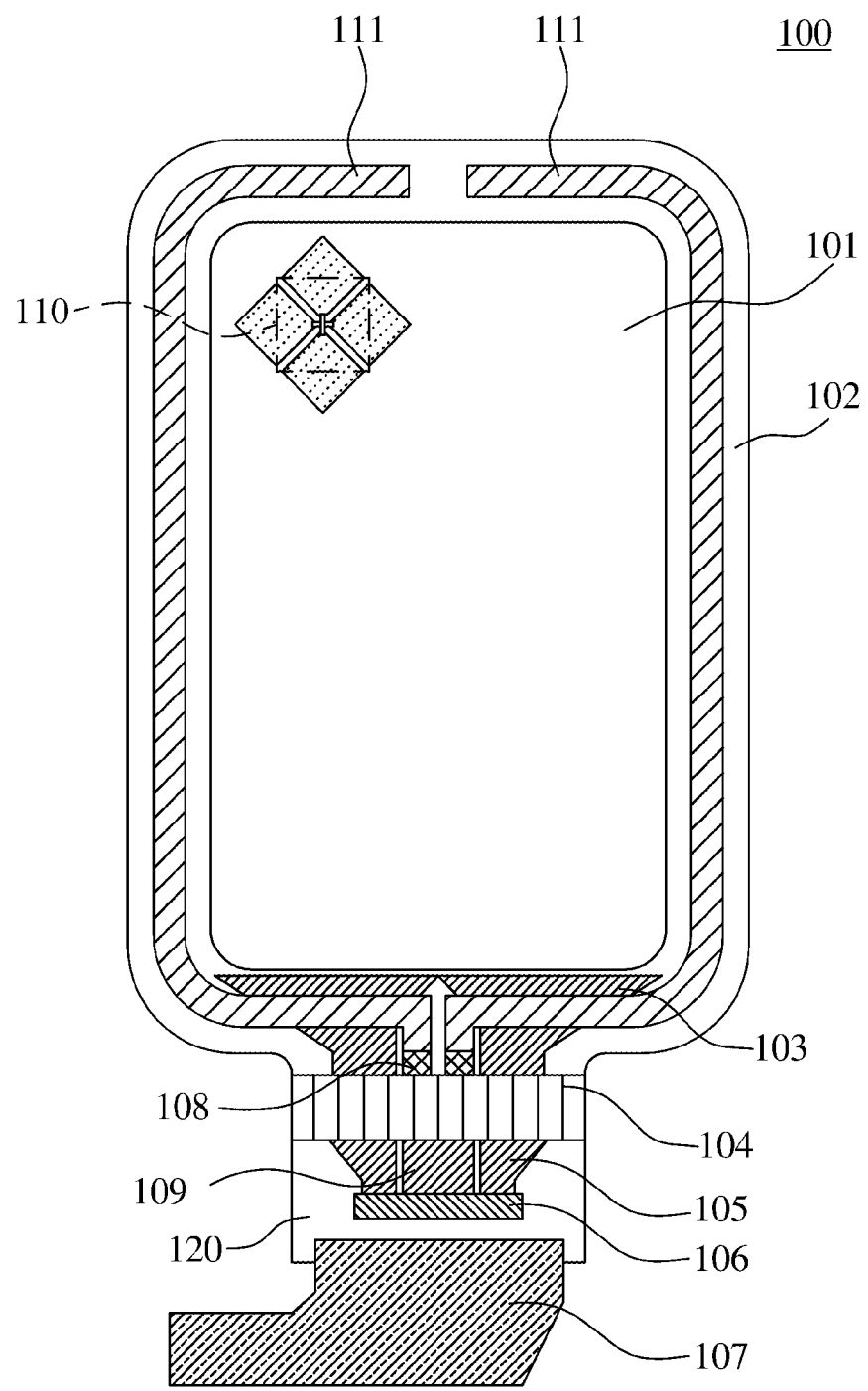
FIG. 4 is a top plan view (including touch lines) of a display panel in accordance with a first embodiment of the present disclosure.
Figure 5:
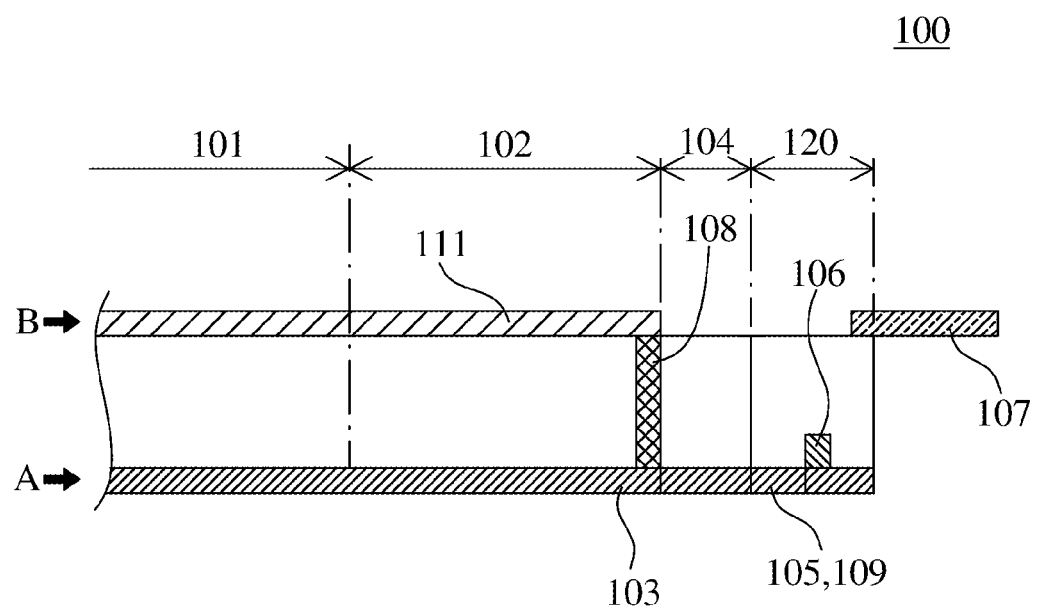
FIG. 5 is a partial side cross-sectional view of a display panel of a first embodiment of the present disclosure.

Referring to FIG. 4 and FIG. 5. FIG. 4 is a top plan view (including touch lines) of a display panel in accordance with a first embodiment of the present disclosure. FIG. 5 is a partial side cross-sectional view of a display panel of a first embodiment of the present disclosure. In fact, FIG. 4 shows that the touch lines formed by the DOT method are added onto the basis of FIG. 3.

As shown in FIG. 4, a plurality of touch units (touch panel units, TP units) 110 are disposed in the display region 101. FIG. 4 shows one of the touch units 110. All of the touch units 110 in the display region 101 are deployed and formed in such a touch unit array.

As shown in FIG. 5, the display panel 100 further includes an array metal layer A and a touch metal layer B. The array metal layer A is generally disposed be to a lower layer of the structure to form lines for transmitting a display signal to the display region 101. The touch metal layer B is generally disposed to be an upper layer of the structure to form lines for transmitting a touch signal to the plurality of the touch units 110.

In addition, the display panel 100 further includes two touch signal lines 111, for example, a transmission signal line (Tx signals) or a reception signal line (Rx signals). FIG. 4 showing the touch signal lines 111 is only a simplified diagram. The touch signal is generated by the touch and drive integrated chip 106, and then transmitted to the touch units 110 in the display regions 101 through the touch signal lines 111. In the present disclosure, through the touch signal interconnection region 108, the transmission of the touch signal generated by the touch and drive integrated chip 106 from the lines of the touch metal layer B to the lines of the array metal layer A (the lines in the array metal layer reserved for the touch signal) is realized.

Furthermore, the touch signal lines 111 are taken as an example to illustrate the touch operation principle of the display panel 100 of the present disclosure. As shown in FIG. 4 and FIG. 5, external working input signal is input from the flexible printed circuit 107 to the touch and drive integrated chip 106. The touch and drive integrated chip 106 processes the input signal and outputs, for example, the signal of the gate drive circuit substrate (gate on array, GOA), the data signal, and the touch (touch panel, TP) signal. The data signal is input to the display region 101 through the lines of the second sector wire region 105, the bending region 104, and the first sector wire region 103 to the display region for driving the display function of the panel. In addition, the TP signal is transmitted through the touch signal deploying region 109, the bending region 104, the touch signal interconnection region 108, and the touch signal lines 111 to the touch units 110 for implementing the touch function.

In summary, conventionally, touch signals are processed by a touch chip (touch integrated circuit, TIC) encapsulated in a flexible printed circuit, but in the present disclosure, the touch signal is switched between the touch metal layer and the array metal layer. That is, a touch signal interconnection region connect the touch metal layer with the array metal layer, the touch and display driver integration (TDDI) design in the panel is realized. That is, the touch and drive integrated chip 106 disposed on the array metal layer is used to process the touch signal. Therefore, since a chip is used to integrate the touch function and the driving function in the present disclosure, the display noise caused by the separation of the display chip and the touch chip in the original system architecture is thus avoided, and the number of components and the overall cost are reduced. Moreover, the length of the flexible printed circuit is shortened, the manufacturing process is simplified, the yield of bonding is improved, the manufacturing cost is reduced, and the width of the bottom bezel of the panel is effectively shortened.

Figure 6A:
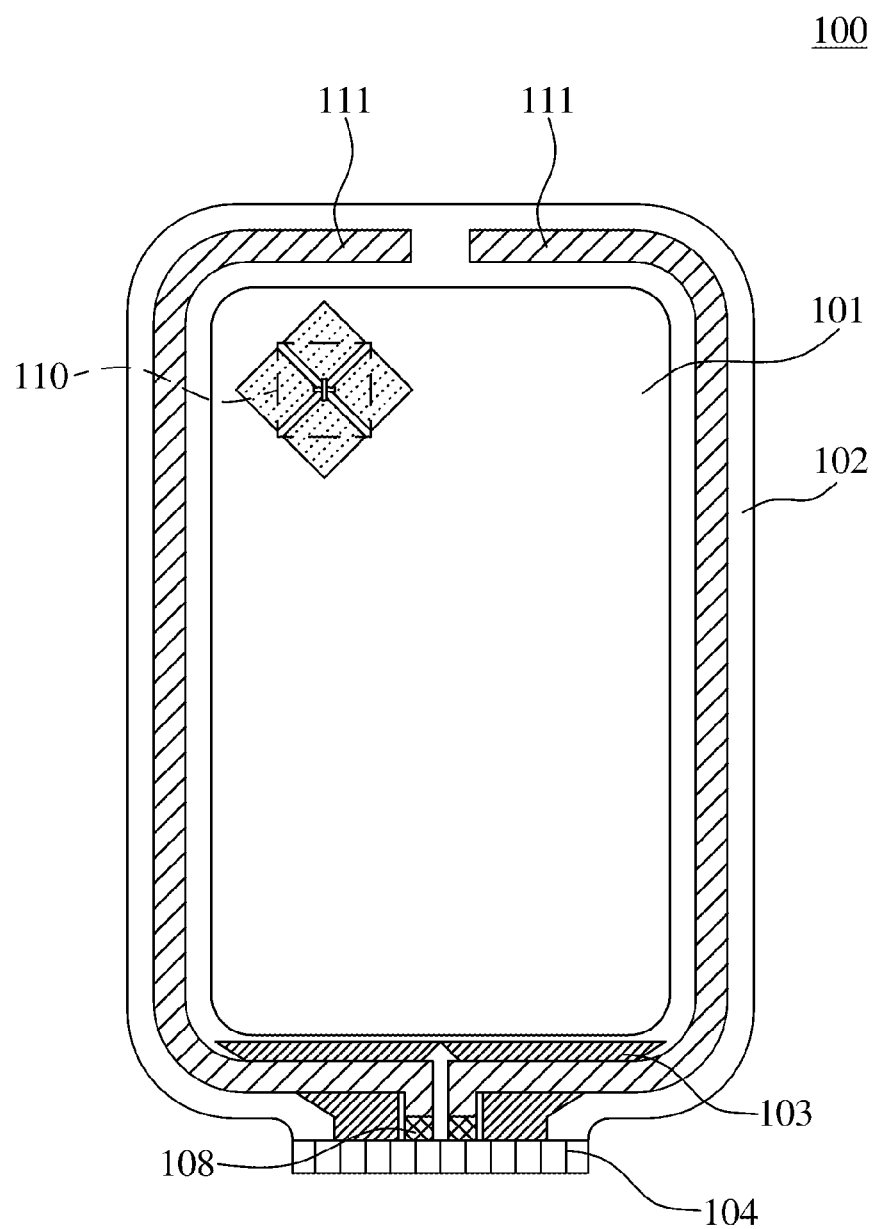
FIG. 6A is a top plan view of a display panel in a folded state in accordance with a first embodiment of the present disclosure.
Figure 6B:
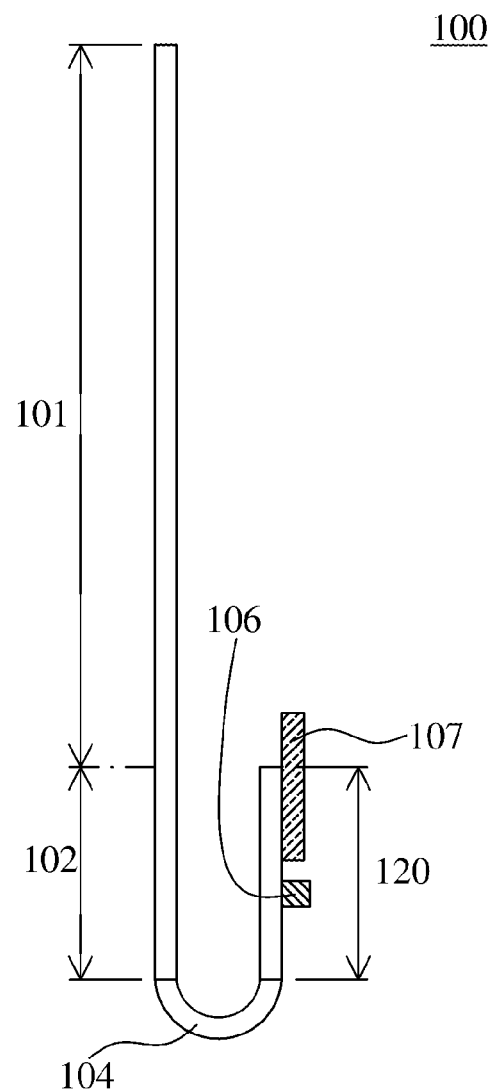
FIG. 6B is a side view of a display panel in a folded state in accordance with a first embodiment of the present disclosure.
Figure 6C:
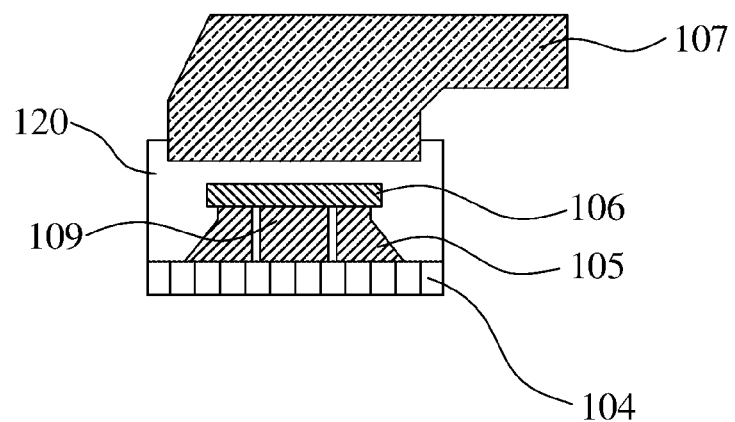
FIG. 6C is a partial rear view of a display panel in a folded state in accordance with a first embodiment of the present disclosure.

Referring to FIG. 6A-FIG. 6C. FIG. 6A is a top plan view of a display panel in a folded state in accordance with a first embodiment of the present disclosure. FIG. 6B is a side view of a display panel in a folded state in accordance with a first embodiment of the present disclosure. FIG. 6C is a partial rear view of a display panel in a folded state in accordance with a first embodiment of the present disclosure.

As shown in FIG. 6A-FIG. 6C, in the present disclosure, because a polyimide substrate, which can be bent at will, is adopted as the bending region 104, as shown in FIG. 6A, the bending region 104 is bent, and the touch and drive integrated chip 106 and the flexible printed circuit 107 are folded to the back of the panel. In addition, FIG. 6B shows a simplified side view of FIG. 6A, and FIG. 6C shows only the components folded to the back of the panel. In the present disclosure, because the touch and drive integrated chip 106 and the flexible printed circuit 107 are folded to the back of the panel, the panel size can be further reduced.

Figure 7:
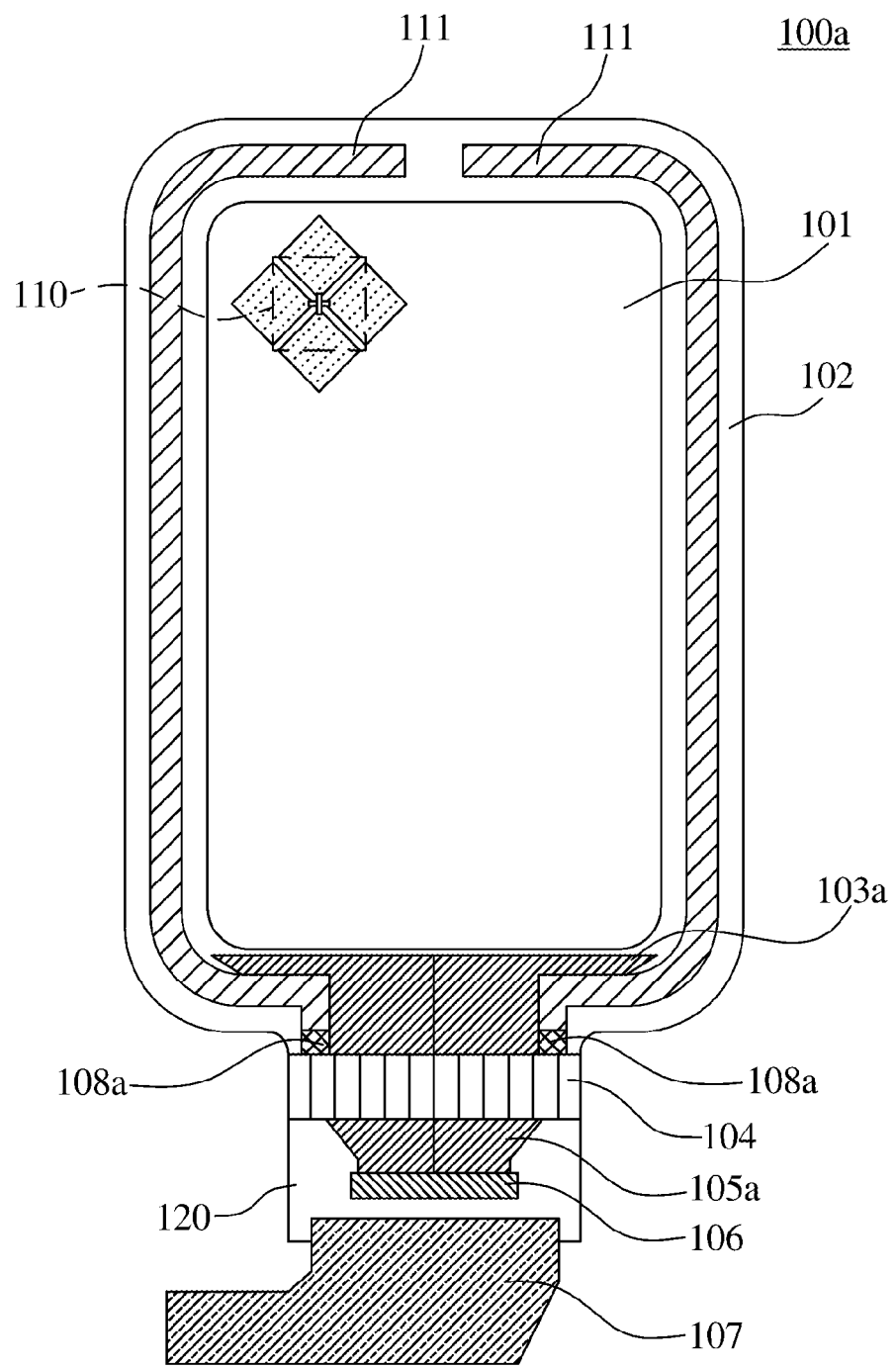
FIG. 7 is a top plan view of a display panel in accordance with a second embodiment of the present disclosure.

Referring FIG. 7, which is a top plan view of a display panel in accordance with a second embodiment of the present disclosure. The display panel 100a of the second embodiment of the present invention is substantially similar to the display panel 100 of the first embodiment of the present disclosure, and thus the same component names are used, but the two are different in that: in the present embodiment, the touch signal deploying region 109 of the first embodiment is omitted, and the function of transmitting the touch signal is provided by lines of at least one second sector wire region 105a. That is, the at least one second sector wire region 105a transmits both display signals and touch signals. In addition, two touch signal interconnection regions 108a of the present embodiment are located on both sides of at least one first sector wire region 103a. In other words, in the present disclosure, the specific position of the touch signal transferring from the touch metal layer B to the array metal layer A is not limited. Users can adjust the exact number and the position of the touch signal interconnection region 108, 108a in accordance with actual needs.

Figure 8:
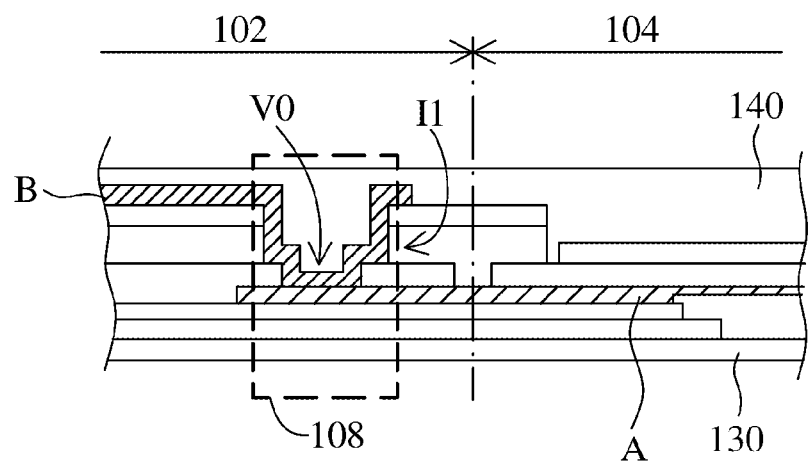
FIG. 8 is a partial side cross-sectional view of a display panel in accordance with a third embodiment of the present disclosure.

Referring to FIG. 8, which is a partial side cross-sectional view of a display panel in accordance with a third embodiment of the present disclosure. The display panel 100b of the third embodiment of the present disclosure is substantially similar to the display panel 100 of the first embodiment of the present disclosure. This embodiment can be regarded as a detailed cross-sectional view of the first embodiment, and the same component names are used. In the embodiment, there is a base layer 130 under the array metal layer A of the display panel 100b, and there is a protective layer 140 on the touch metal layer B. The at least one touch signal interconnection region 108 is located in the non-display region of the display panel, and there is a first insulating layer I1 between the first metal layer A and the touch metal layer B, and the at least one touch signal interconnection region 108 is provided with a plurality of interconnection via holes V0 (shown as an interconnection via hole V0 in the figure), and the interconnection via holes V0 pass through the insulating layer I1 for connecting the lines of the array metal layer A with the lines of the lines of the touch metal layer B.

Figure 9:
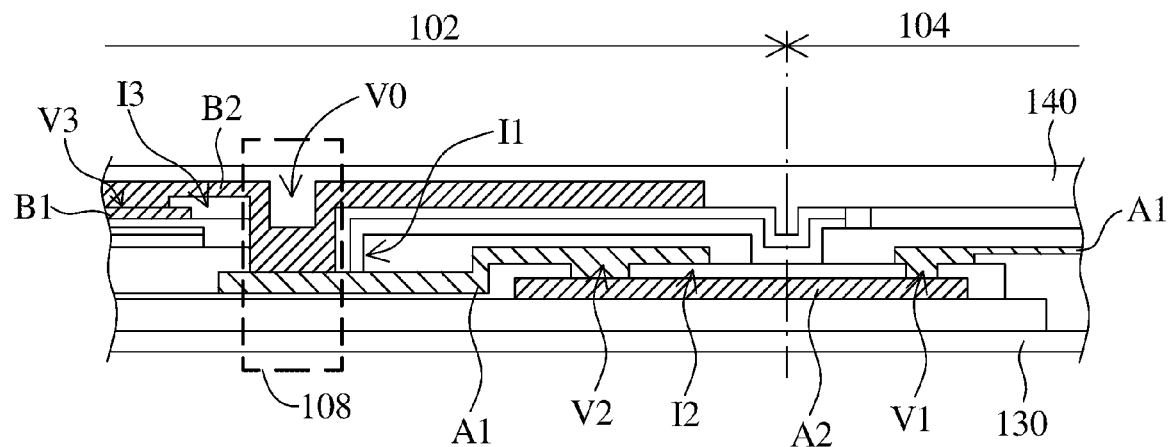
FIG. 9 is a partial side cross-sectional view of a display panel in accordance with a fourth embodiment of the present disclosure.

Referring FIG. 9, which is a partial side cross-sectional view of a display panel in accordance with a fourth embodiment of the present disclosure. The display panel 100c of the fourth embodiment of the present disclosure is substantially similar to the display panel 100b of the third embodiment of the present disclosure, and thus the same component names are used, but the two are different in that: in the present embodiment, the array metal layer includes a source drain metal layer A1 and a gate metal layer A2. A portion of the source drain metal layer A1 is located in the non-display region 102, and the other portion is located in the bending region 104. A second insulating layer 12 is disposed between the gate metal layer A2 and the source drain metal layer A1. The second insulating layer 12 is provided with a first via hole V1 and a second via hole V2. A line of the gate metal layer A2 in the bending region 104 is connected with the source drain metal layer A1 located in the bending region 104 through the first via hole V1. A line of the gate metal layer A2 in the non-display region 102 is connected with the source drain metal layer A1 located in the non-display region 102 through the second via hole V2.

In addition, the touch metal layer includes a first touch metal layer B1 and a second touch metal layer B2. A touch insulation layer 13 is disposed between the first touch metal layer B1 and the second touch metal layers B2. The touch insulation layer 13 is provided with a third via hole V3, and the first touch metal layer B1 is connected with the second touch metal layer B2 through the third via hole V3.

In summary, the present disclosure provides a display panel, and provides, in particular, a TDDI technical solution in an AMOLED panel. A touch and drive integrated chip is used to integrate the touch function and the drive function, and necessarily by the above specific line schemes, a touch signal is conducted from a touch metal layer to an array metal layer. Therefore, display noise caused by separation of a display chip and a touch chip in the original system architecture is thus avoided, and the number of components and the overall cost are reduced. Moreover, the length of a flexible printed circuit is shortened, the manufacturing process is simplified, the yield of bonding is improved, the manufacturing cost is reduced, and the width of the bottom bezel of the panel is effectively shortened.

The present disclosure has been described by the above related embodiments, but the above embodiments are merely examples for implementing the present disclosure. It must be noted that the scope of the present disclosure is not limited to the disclosed embodiments. Rather, modifications and equivalent arrangements included in the spirit and the scope of the claims are within the scope of the present disclosure.

What is claimed is:

1. A display panel comprising a display region and a non-display region, the non-display region including at least one touch signal interconnection region, a bending region, a chip deploying region, and a flexible printed circuit region sequentially disposed away from the display region, wherein the display panel further comprises:
    a plurality of touch units disposed on the display region;
    an array metal layer configured to form lines for transmitting a display signal to the display region;
    a touch metal layer configured to form lines for transmitting a touch signal to the plurality of touch units;
    a first insulating layer disposed between the array metal layer and the touch metal layer, and having an interconnection via hole;
    a single touch and drive integrated chip disposed within the chip deploying region for processing the display signal and the touch signal; and
    a flexible printed circuit disposed in the flexible printed circuit region, and inputting an external working input signal to the touch and drive integrated chip, but directly connected to neither the lines of the array metal layer nor the lines of the touch metal layer;
    wherein the interconnection via hole is disposed in the touch signal interconnection region to connect the touch metal layer with the array metal layer in the bend region;
    wherein the array metal layer includes a source drain metal layer, the interconnection via hole is configured to connect the source drain metal layer with the touch metal layer; and
    wherein the array metal layer further includes a gate metal layer, a second insulating layer is disposed between the gate metal layer and the source drain metal layer, the second insulating layer is provided with a first via hole and a second via hole, a line of the gate metal layer in the bending region is connected with the source drain metal layer located in the bending region through the first via hole, and a line of the gate metal layer in the non-display region is connected with the source drain metal layer located in the non-display region through the second via hole.

2. The display panel as claimed in claim 1, wherein the display signal is transmitted from the single touch and drive integrated chip to the display region through the lines of the array metal layer; and the touch signal is transmitted from the single touch and drive integrated chip to the plurality of touch units through the lines of the array metal layer located within the bending region, the interconnection via hole located within the touch signal interconnection region, and the lines of the touch metal layer within the non-display region around the display region.

3. The display panel as claimed in claim 1, wherein the touch metal layer includes a first touch metal layer and a second touch metal layer, a touch insulation layer is disposed between the first touch metal layer and the second touch metal layers, the touch insulation layer is provided with a third via hole, and the first touch metal layer is connected with the second touch metal layer through the third via hole.

4. The display panel as claimed in claim 1, further comprising at least one first sector wire region between the bending region and the display region, wherein the first sector wire region includes a plurality of data lines for connecting the bending region with the display region.

5. The display panel as claimed in claim 4, wherein the at least one first sector wire region includes two first sector wire regions, and the at least one touch signal interconnection region is located between the two first sector wire regions.

6. The display panel as claimed in claim 4, wherein the at least one touch signal interconnection region includes two touch signal interconnection regions located between the at least one first sector wire region or on both sides of the at least one first sector wire region.

7. The display panel as claimed in claim 1, further comprising at least one second sector wire region located in the chip deploying region, wherein the second sector wire region includes a plurality of data lines for connecting the bending region with the touch and drive integrated chip.

8. The display panel as claimed in claim 7, wherein the at least one second sector wire region includes two second sector wire regions for transmitting the display signal, and a touch signal deploying region is disposed between the two second sector wire regions for transmitting the touch signal.

* * * * *